United States Patent [19]

Goldburt et al.

[11] Patent Number: 4,900,136
[45] Date of Patent: Feb. 13, 1990

[54] METHOD OF METALLIZING SILICA-CONTAINING GEL AND SOLID STATE LIGHT MODULATOR INCORPORATING THE METALLIZED GEL

[75] Inventors: Efim S. Goldburt; Richard E. Hemmer, both of Briarcliff Manor, N.Y.; James K. McKinlay, Ridgefield, Conn.; Robert L. Bronnes, Irvington, N.Y.

[73] Assignee: North American Philips Corporation, New York, N.Y.

[21] Appl. No.: 292,632

[22] Filed: Oct. 28, 1988

Related U.S. Application Data

[63] Continuation of Ser. No. 84,262, Aug. 11, 1987, abandoned.

[51] Int. Cl.⁴ .......................... G02F 1/17; G02F 1/23
[52] U.S. Cl. ..................................... 350/360; 350/361
[58] Field of Search ............... 350/355, 356, 353, 359

[56] References Cited

U.S. PATENT DOCUMENTS

| | | | |
|---|---|---|---|
| 3,907,407 | 9/1975 | Vilkomerson et al. | 350/360 |
| 3,980,476 | 9/1976 | Wysocki | 350/356 X |
| 4,013,345 | 5/1977 | Roach | 350/360 |
| 4,294,507 | 10/1981 | Johnson | 350/96.13 |
| 4,299,450 | 11/1981 | Funada et al. | 350/360 |
| 4,485,066 | 11/1984 | Balthis et al. | 264/341 |
| 4,494,826 | 1/1985 | Smith | 350/360 |
| 4,626,920 | 12/1986 | Glenn | 350/360 |

Primary Examiner—Eugene R. Laroche
Assistant Examiner—Nathan W. McCutcheon
Attorney, Agent, or Firm—John C. Fox

[57] ABSTRACT

A solid state light modulator structure useful in a video display system includes a deformable silica containing gel layer on an array of charge storage elements, and an adherent, highly light reflective metal (e.g., Ag) electrode layer formed directly on the surface of the gel layer by sputtering in a non-reactive atmosphere.

4 Claims, 1 Drawing Sheet

METHOD OF METALLIZING SILICA-CONTAINING GEL AND SOLID STATE LIGHT MODULATOR INCORPORATING THE METALLIZED GEL

This is a continuation of application Ser. No. 084,262, filed Aug. 11, 1987, now abandoned.

CROSS-REFERENCE TO RELATED APPLICATION

Co-pending U.S. patent application, Ser. No. 084,260, filed concurrently herewith, claims a method for metallizing a silica-containing gel, in which the gel surface is treated with an oxygen-containing plasma prior to metallization, and a solid state modulator incorporating the metallized gel.

BACKGROUND OF THE INVENTION

This invention relates to a solid state light modulator structure useful in an apparatus for generating an image from a video input signal, and more particularly relates to such a structure including a deformable metallized elastomer layer, and also relates to a method for metallizing the layer.

U.S. Pat. No. 4,626,920 describes a video display system of the type employing solid state light modulator structures including a deformable, metallized elastomer layer. In this light modulator structure, the deformable layer, for example, a metallized silica-containing gel layer, is disposed over an array of electrodes on the surface of a solid state charge storage device, such as a charge coupled semiconductor device. The metal layer on the surface of the gel serves both as an electrode and as a light reflecting layer.

In operation, electric fields associated with the charge pattern of a stored video frame cause electrostatic attractions between the electrode array and the surface electrode, resulting in deformation of the gel layer in a pattern corresponding to the charge pattern. This pattern is analagous to a phase diffraction grating. The information contained in this pattern is then "read" by reflecting light from the deformed electrode into an optical subsystem such as a Schlieren type of optical system, which then translates the information into a viewable image on a screen.

A critical step in the formation of these light modulator structures is the formation of the light reflective electrode layer on the gel surface. In order for the device to operate successfully, such layer must be electrically conductive, flexible and adherent to the gel layer, and is preferably highly specularly reflective. Unfortunately, since gels are semisolids, having structures which may be characterized as having a liquid phase distributed in an open polymer network, they provide poor surfaces for adhesion.

In the referenced U.S. patent, an electrode layer with the desired characteristics is provided by first providing a thin pellicle layer of nitrocellulose on the gel surface, to provide a surface for adhesion, and to isolate the electrode layer from gel components which could attack and degrade it. Next, a thin intermediate layer of gold is evaporated onto the pellicle layer, followed by evaporation of a thin silver layer onto the gold layer. The gold layer enables the deposition of the silver layer with sufficient uniformity to result in a highly reflective layer.

While it would be desirable from the standpoint of manufacturing efficiency to eliminate the intermediate pellicle and gold layers, it has been found that the deposition of silver directly onto the gel surface by evaporation results in an extremely low specular reflectance, that is, less than one percent. G. C. Martin et al., J. Appl. Phys. 53 (1), 797 (1985).

Accordingly, it is a principal object of the invention to provide a solid state light modulator structure of the type described herein having an adherent, highly reflective metal layer on the surface of the gel layer.

It is another object of the invention to provide a method for forming an adherent, highly reflective metal layer directly onto a silica-containing gel surface without the need for forming intermediate or transitional layers.

SUMMARY OF THE INVENTION

In accordance with the invention, there is provided a solid state light modulator structure comprising:

(a) a solid state charge storage device comprising an array of charge storage elements formed in a semiconductor substrate, each element associated with at least one display electrode on the surface of the substrate, (b) a deformable elastomer layer disposed on the surface of the charge storage device, the layer covering the array of display electrodes, and (c) a flexible, adherent and light reflective conductive layer disposed over the elastomer layer, characterized in that the elastomer layer is a silica-containing gel, the conductive layer is a metal layer, and the metal layer is bonded directly to the gel layer.

Such a solid state light modulator structure is further characterized in accordance with the invention in that the metal layer is selected from the group consisting of silver, aluminum and indium, and is preferably silver, having a specular reflectance of visible light of at least 90 percent.

In accordance with another aspect of the invention, there is provided a method for forming an adherent, light reflective metal layer directly onto the surface of a silica-containing gel, the method comprising sputtering the metal onto the gel surface in a nonreactive atmosphere such as an inert gas.

Such sputtered metal atoms arrive at the gel surface with much greater kinetic energy (one or more orders of magnitude greater) than if such atoms were evaporated. This high energy is thought to be responsible for the formation of a chemical bond between the metal atoms and silicon atoms at or near the gel-metal layer interface. The sputtered metal layer is thus adherent to the gel surface and highly reflective. Where the metal is silver, layers having specular reflectances greater than 90 percent are obtainable.

BRIEF DESCRIPTION OF THE DRAWING

The single FIGURE is a cross-section view of one embodiment of a solid state light modulator structure in accordance with the invention.

DESCRIPTION OF THE PREFERRED EMBODIMENTS

Figure 1:
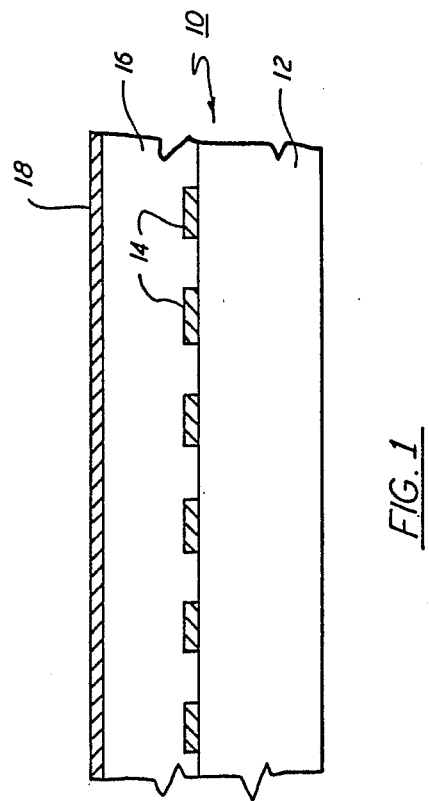

In the FIGURE, a solid state light modulator 10 comprises a charge storage device including semiconductor substrate 12, such as silicon, including an array of charge storage elements (not shown) formed in the substrate, each charge storage element associated with at least one display electrode 14 on the substrate surface. Such a charge storage device may, for example, comprise a charge coupled device. A detailed description of the structure and operation of these devices is unnecessary to an understanding of this invention, and may be found, for example, in U.S. Pat. No. 3,882,271.

Disposed over the top of the charge storage element array is a deformable elastomer layer 16, herein a silica-containing gel. An adherent, light reflective metal electrode layer 18 is disposed on the top surface of elastomer lay 16, completing the light modulator.

In operation, a charge array stored in the light modulator structure representing for example, a video frame, in conjunction with a potential applied between the array of display electrodes and the upper light reflective electrode layer, results in a variation of potential across the gel layer 16, and electrostatic attraction forces between the electrode array 14 and the light reflective electrode 18, causing deformation of gel layer 16 and reflective layer 18. Such deformation results in a rippled pattern on the surface of the gel and the light reflective layer 18, which pattern can then be "read" by reflecting light from the surface into a Schlieren optical system, which translates the pattern into a visual display image. Such an optical system and its operation are described in more detail in the above-referenced U.S. Pat. Nos. 4,626,920 and 3,882,271.

As may be appreciated, the successful and efficient operation of the modulator structure is dependent upon the electrode layer 18 having sufficient flexibility and sufficient adherence to the gel surface so that it faithfully reproduces the deformations in the gel layer 16. In addition, the electrode layer 18 is preferably highly specularly reflective, so that the largest possible amount of light incident on the surface is reflected back into the optical system for display of the stored image.

However, attempts to simply evaporate a metal layer such as silver onto the surface of a silica-containing gel such as a polydimethyl siloxane (PDMS), results in poor adhesion to the surface and a very low specular reflectance (less than one percent). In accordance with the teachings of the invention, it has been discovered that forming the metal layer by sputtering in an inert gas such as argon results in a layer which is highly specularly reflective (greater than 90 percent in the case of silver) and which adheres well to the gel surface. Such a layer is believed to result from a modification of the gel surface by the plasma present in the sputtering environment, by changing the crosslinking in the gel surface, and promoting a chemical reaction between the sputtered metal and the gel surface. The crosslinking is believed to make the gel surface more rigid, while the chemical reaction is believed to improve the bonding between the gel layer and the sputtered metal layer.

The sputtering may be carried out over a wide range of operating conditions. For example, the gas pressure may range from about 50 to about 200 micrometers, and the current may range from about 20 to about 500 milliamps. As is known, the sputtering deposition rate generally increases with increasing current, and the current increases with increasing gas pressure. As is also known, a high deposition rate may result in undesirable heating of the substrate. In such cases, deposition may be carried out in stages, with rest periods to allow cooling of the substrate to occur. In the alternative, provision may be made for actively cooling of the substrate in order to allow for continuous deposition.

The gel layer should have a modulus of elasticity within a range to allow the required amount of deformation, which is determined by device geometry as well as the wavelength of the light to be modulated. By way of example, red light having a wavelength of from about 550 to 570 nanometers may be modulated in a structure having a gel layer about 10 microns in thickness and having a modulus of elasticity between about 104 and 106 dynes per square centimeter. When a field of about 50 volts is impressed across the gel layer between the electrode array on the surface of the semiconductor and the flexible metal electrode on the surface of the gel, an electrostatic attraction results in deformation of the gel by an amount of up to about 0.2 micrometers.

Particularly suitable for use as the gel layer in these structures are polydimethyl siloxanes (PDMS), which may be readily synthesized by curing a mixture of A and B components, where A is dimethylvinyl terminated polydimethyl siloxane and B is trimethyl terminated siloxane with partially hydrogen-substituted methyl side groups. These components are commercially available, for example, from the Dow Chemical Company under the tradename Dow Sylgard 527. Gels having various moduli of elasticity may be synthesized simply by varying the weight ratio of A to B. For example, varying the weight ratio of A:B from 1:1 to 1:2 results in a modulus of elasticity variation of approximately an order of magnitude. As is known, the modulus of elasticity may also be varied by changing the molecular weight of the A component, for example by washing or fractionation, and by changing the functionality of the B component, defined as the number of H side groups, for example, by the same techniques.

EXPERIMENTAL

Sample Preparation

Dow Sylgard 527 compounds were used for the synthesis of PDMS gels with A:B weight ratios of 1:1, 1:1.25, 1:1.5, 1:2, and 1:5. The average molecular weight distribution of both A and B components was broad and centered around 20,000 grams/mole. The components were mixed in the liquid state and formed into thin layers by spinning onto 17×17 millimeter monoscope substrates. Monoscopes were used instead of silicon semiconductor chips in order to enable study of the viscoelastic properties of the gels. The layers were gelled by curing them at a temperature of about 100° C. for a time of about one hour. The thickness of the cured layers was about 10 micrometers.

Silver layers characterized as thick (about 1,000 angstroms) and thin (about 20 angstroms) were then sputtered onto the PDMS gel layers using sputtering conditions as follows: argon gas at a pressure of 160 micrometers, current at 200 milliamps, source-target distance at about 1¼ inch. The thick samples were produced by sputtering in pulses of 15 seconds duration, followed by 5 minutes of rest, while the thin samples were produced by a single pulse of less than 5 seconds duration. The silver thickness in the thin samples was determined by assuming a linear rate of silver deposition and extrapolating gravimetric measurements for the thick samples.

A silver standard for X-ray photoelectron spectroscopy (XPS) was prepared by sputtering a thick silver layer onto a quartz substrate using the same sputtering conditions described above. A gel standard was prepared having an A:B ratio of 1:1.5 and having a surface free of any deposited metal. A gold standard was also formed by evaporating a thin gold layer on to a gel layer having an A:B ratio of 1:1.

Surface Reflectivity

The thick silver layers obtained by sputtering are highly specular reflective (greater than 90 percent) and have a pale yellow color.

XPS

XPS studies were conducted using a magnesium $K_\alpha$ source at 300 watts with an analyzer including a triple detector having a resolution of 1.05 electron volts at 20 electron volts of pass energy, measured at the silver $3d_{5/2}$ peak. The gold standard was assigned a peak value of 83.8 electron volts. The difference between this peak and the actual gold peak of 92.4 electron volts was assumed to be due to sample charging, and this value was used for assigning positions to the peaks in the silver samples.

Survey scans of both the thick and thin silver samples were conducted at low (from about 5 to 605 electron volts) and high (from about 600 to 1200 electron volts) binding energy, using 0.2 electron volt steps at 500 milliseconds per channel and a detector pass energy of 50 electron volts.

High resolution scans were then recorded in the vicinity of the silicon 2p, silicon 2s, carbon 1s, oxygen 1s, and silver 3d peaks, using 0.05 electron volt steps at 500 milliseconds per channel and a detector pass energy of 20 electron volts. The peak positions for the silver standard, the thin silver samples and the gel standard obtained from these scans are listed in Table I. All peak positions except the Auger peak positions were measured from the high resolution scans. The Auger peak positions were determined from the survey scans.

TABLE I

| Element | Silver Standard | 1:1 | 1:1.25 | 1:1.5 | 1:2 | 1:5 | Gel Standard |
|---|---|---|---|---|---|---|---|
| Si 2p | — | 102.10 | 102.05 | 102.10 | 102.10 | 102.00 | 102.20 |
| O 1s | — | 532.05 | 532.00 | 532.00 | 532.10 | 532.00 | 532.30 |
| C 1s | — | 284.45 | 284.35 | 284.45 | 284.45 | 284.35 | 284.50 |
| Ag 3d 5/2 | 368.10 | 367.85 | 367.85 | 367.90 | 367.90 | 367.85 | — |
| Ag α | 527.6 | 528.4 | 528.5 | 528.4 | 528.3 | 528.2 | — |

Auger Parameter of Sputtered Silver

Table I shows the silicon 2p, oxygen 1s, carbon 1s, and silver $3d_{5/2}$ peak positions corrected for charging, and the Auger parameter for silver ($\alpha$) for the thin samples, the silver standard and the gel standard. The variations in the peak positions are within experimental error except for the silver Auger parameter $\alpha$ which has shifted considerably (about 0.8 electron volts) in the thin samples, indicating a change in the chemical state of the silver sputtered on to the gel surfaces. The thick samples did not show such a shift in $\alpha$, indicating that a chemical bond is formed between the sputtered silver and the gel surface at or near the gel-silver layer interface.

Areas under the peaks on the survey scans were measured, and the ratios of the areas under the silver peaks to the areas under the peaks for silicon, oxygen and carbon were computed. These ratios are listed in Table II for the thick and thin silver samples.

TABLE II

| A to B Ratio | O | Ag | Ag/O | C | Ag | Ag/C | Si | Ag | Ag/Si |
|---|---|---|---|---|---|---|---|---|---|
| Silver Thickness (A) 20 | | | | | | | | | |
| 1:1 | 19.5 | 80.5 | 4.1 | 18.0 | 82.0 | 4.6 | 4.4 | 95.6 | 21.6 |
| 1:1.25 | 16.5 | 83.5 | 5.1 | 15.0 | 85.0 | 5.7 | 4.3 | 95.7 | 22.4 |
| 1:1.5 | 15.6 | 84.4 | 5.4 | 16.2 | 83.8 | 5.2 | 4.3 | 95.7 | 22.1 |
| 1:2 | 17.8 | 82.2 | 4.6 | 15.9 | 84.1 | 5.3 | 4.7 | 95.3 | 20.2 |
| 1:5 | 14.3 | 85.7 | 6.0 | 15.7 | 84.3 | 5.4 | 3.5 | 96.5 | 28.0 |
| Silver Thickness (A) 1000 | | | | | | | | | |
| 1:1 | 16.2 | 84.8 | 5.2 | 11.3 | 88.7 | 7.9 | 4.8 | 95.2 | 19.8 |
| 1:1.25 | 11.8 | 88.2 | 7.5 | 7.4 | 92.6 | 12.6 | 2.5 | 97.5 | 39.0 |
| 1:1.5 | 10.7 | 89.3 | 8.3 | 8.0 | 92.0 | 11.5 | 1.2 | 98.8 | 81.0 |
| 1:2 | 13.2 | 86.8 | 6.6 | 8.6 | 91.4 | 10.6 | 2.9 | 97.1 | 33.8 |
| 1:5 | 15.9 | 84.1 | 5.3 | 11.0 | 89.0 | 8.1 | 4.2 | 95.8 | 22.6 |

Etching and Etch Rate of Gels

The survey scans for both the thick and thin samples showed silicon 2p and other peaks associated with the gel structure, indicating that etching of the gel occurred during sputtering.

Table II shows the ratios of the silver peak areas to the silicon, oxygen, and carbon peak areas for the thick and thin samples with varying ratios of A:B. The data for the thick samples indicates that the amount of etching depends upon the degree of gel crosslinking. The peak area ratios of the thick samples reaches a maximum (silver/silicon=81.0) for the A:B ratio of 1:1.5, apparently indicating that the etch rate is slower in the 1:1.5 samples and faster in the 1:1 and 1:5 samples, with the etch rates of these latter samples being approximately the same.

While there have been shown and described what are at present considered to be the preferred embodiments of the invention, it will be apparent to those skilled in the art that various changes and modifications may be made therein without departing from the scope of the invention as defined by the appended claims.

What is claimed is:

1. A solid state light modulator structure comprising:
   (a) a solid state charge storage device comprising an array of charge storage elements formed in a semiconductor substrate, each element associated with at least one display electrode on the surface of the substrate,
   (b) a deformable elastomer layer disposed on the solid state device, the layer covering the electrode array, and
   (c) a flexible, adherent and light reflective conductive layer disposed over the elastomer layer,
   characterized in that the elastomer layer is polydimethyl siloxane gel, the conductive layer consists of a single sputtered metal layer, and the metal layer is bonded directly to the gel layer.

2. The solid state light modulator of claim 1 in which the metal in the conductive metal layer is selected from the group consisting of silver, aluminum and indium.

3. The solid state light modulator of claim 2 in which the metal is silver.

4. The solid state light modulator of claim 3 in which the specular reflectance of the silver layer is at least 90 percent.

* * * * *